(12) United States Patent
Lin et al.

(10) Patent No.: US 12,356,867 B2
(45) Date of Patent: Jul. 8, 2025

(54) SEMICONDUCTOR STRUCTURE AND METHOD OF MANUFACTURE

(71) Applicant: TAIWAN SEMICONDUCTOR MANUFACTURING COMPANY LIMITED, Hsin-Chu (TW)

(72) Inventors: Chia-Hua Lin, New Taipei (TW); Yao-Wen Chang, New Taipei (TW)

(73) Assignee: TAIWAN SEMICONDUCTOR MANUFACTURING COMPANY LIMITED, Hsin-Chu (TW)

(*) Notice: Subject to any disclaimer, the term of this patent is extended or adjusted under 35 U.S.C. 154(b) by 463 days.

(21) Appl. No.: 17/837,370

(22) Filed: Jun. 10, 2022

(65) Prior Publication Data

US 2023/0413682 A1 Dec. 21, 2023

(51) Int. Cl.
*H10N 50/80* (2023.01)
*G11C 11/16* (2006.01)
*H01L 21/768* (2006.01)
*H01L 23/522* (2006.01)
*H10B 61/00* (2023.01)
*H10N 50/01* (2023.01)
*H10N 50/10* (2023.01)

(52) U.S. Cl.
CPC .......... *H10N 50/80* (2023.02); *G11C 11/161* (2013.01); *H01L 21/76802* (2013.01); *H01L 23/5226* (2013.01); *H10B 61/00* (2023.02); *H10N 50/01* (2023.02); *H10N 50/10* (2023.02)

(58) Field of Classification Search
CPC .......... H01L 23/5226; H01L 21/76802; H10N 50/80; H10N 50/01; H10N 50/10; G11C 11/161; H10B 61/00
See application file for complete search history.

(56) References Cited

U.S. PATENT DOCUMENTS

| | | | |
|---|---|---|---|
| 2020/0106008 A1* | 4/2020 | Peng | H10B 61/00 |
| 2020/0365802 A1* | 11/2020 | Peng | H10N 70/023 |
| 2021/0057639 A1* | 2/2021 | Ku | H10N 50/10 |
| 2022/0029091 A1* | 1/2022 | Wang | H10N 50/80 |
| 2022/0044717 A1* | 2/2022 | Huang | H10N 50/10 |
| 2022/0052255 A1* | 2/2022 | Yang | H10B 61/00 |
| 2022/0157886 A1* | 5/2022 | Chuang | H01L 21/76816 |

* cited by examiner

*Primary Examiner* — Shaun M Campbell
(74) *Attorney, Agent, or Firm* — Cooper Legal Group, LLC

(57) ABSTRACT

A semiconductor structure includes a bottom electrode, a magnetic tunneling junction stack over the bottom electrode, a top electrode over the magnetic tunneling junction stack, a first dielectric layer under the bottom electrode, a second dielectric layer under the first dielectric layer. The first dielectric layer has a first chemical bond energy and the second dielectric layer has a second chemical bond energy less than the first chemical bond energy.

20 Claims, 6 Drawing Sheets

SEMICONDUCTOR STRUCTURE AND METHOD OF MANUFACTURE

BACKGROUND

Magnetic random access memory (MRAM) is a technology for storing data. MRAM stores data based on a resistance of a magnetic tunnel junction (MTJ) device within an MRAM cell. The MTJ device typically comprises two magnetic layers separated by an insulator layer. Data is written to the MRAM cell by altering a magnetic field direction of one of the magnetic layers of the MTJ device. The magnetic field direction affects the resistance of the MTJ device, thereby storing the written data.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
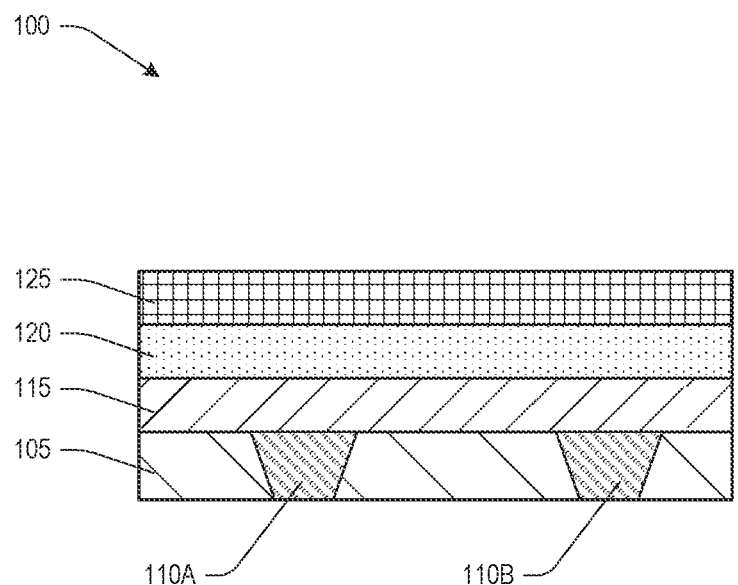
FIGS. 1-12 are illustrations of a semiconductor structure at various stages of fabrication, in accordance with some embodiments.

The following disclosure provides many different embodiments, or examples, for implementing different features of the provided subject matter. Specific examples of components and arrangements are described below to simplify the present disclosure. These are, of course, merely examples and are not intended limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present application relates to one or more semiconductor structures and/or one or more methods for fabricating one or more semiconductor structures. According to some embodiments, a semiconductor structure is formed by forming a first dielectric layer and forming an etch resistant layer over the first dielectric layer. A conductive via is formed extending through the first dielectric layer and the etch resistant dielectric layer. Layers of a memory structure are formed over the etch resistant dielectric layer. The layers of the memory structure are etched using a mask as a removal template. The etch resistant dielectric layer, which may comprise amorphous carbon or carbon nitride, has a chemical bond energy or binding energy greater than the first dielectric layer, which may comprises silicon rich oxide. Due to the increased chemical bond energy or binding energy, a removal rate of the etch resistant dielectric layer is less than a removal rate of the first dielectric layer. This increased resistance to removal increases the degree of control in the etch process to allow patterning of the layers of the memory structure and patterning of the first dielectric layer and the etch resistant dielectric layer without completely removing the first dielectric layer. Conductive structures under the memory structure and adjacent the memory structure, for example in a lower metallization layer, are protected by a remaining portion of the first dielectric layer. The enhanced etch control allows a thickness of the first dielectric layer to be reduced, thereby reducing the aspect ratio between adjacent memory structures and reducing the likelihood of voids forming in a dielectric layer formed over and between the memory structures.

In some embodiments, the memory structure is a magnetic random access memory that employs a magnetic tunneling junction stack. The etch process for patterning the layers of the memory structure and the etch resistant layer may be a reactive ion etch. The material of the etch resistant layer may be removed without re-sputtering and depositing on exposed sidewalls of the magnetic tunneling junction stack, thereby reducing the likelihood of shorts forming between layers of the magnetic tunneling junction stack.

FIGS. 1-11 are illustrations of a semiconductor structure 100 at various stages of fabrication, in accordance with some embodiments. FIGS. 1-11 include cross-sectional views and top views of the semiconductor structure 100. Referring to FIG. 1, a first dielectric layer 105 is formed, lower conductive structures 110A, 110B are formed in the first dielectric layer 105, an etch stop layer 115 is formed over the lower conductive structures 110A, 110B and the first dielectric layer 105, a second dielectric layer 120 is formed over the etch stop layer 115, and a etch resistant layer 125 is formed over the second dielectric layer 120, in accordance with some embodiments.

The first dielectric layer 105 comprises silicon dioxide, a low-k dielectric material, one or more layers of low-k dielectric material, and/or other suitable materials. Low-k dielectric materials have a k value lower than about 3.9. The materials for the first dielectric layer 105 comprise at least one of Si, O, C, or H, such as carbon doped oxide dielectrics, SiCOH or SiOC, or other suitable materials. Organic material such as polymers may be used for the first dielectric layer 105. The first dielectric layer 105 may comprise at least one of a carbon-containing material, organo-silicate glass, a porogen-containing material, nitrogen, and/or or other suitable materials. The first dielectric layer 105 may be formed by at least one of atomic level deposition (ALD), chemical vapor deposition (CVD), low pressure chemical vapor deposition (LPCVD), atomic level chemical vapor deposition (ALCVD), ultrahigh vacuum CVD (UHVCVD), reduced pressure CVD (RPCVD), plasma enhanced CVD (PECVD), molecular beam epitaxy (MBE), liquid phase epitaxy (LPE), spin coating, spin-on technology, or other suitable techniques.

The lower conductive structures 110A, 110B may comprise a barrier layer, a seed layer, a metal fill layer, and/or other suitable layers. In some embodiments, the lower conductive structures 110A, 110B comprise tungsten, aluminum, copper, cobalt, and/or other suitable materials.

lower conductive structures 110A, 110B may be formed using a damascene process (not shown) in which one or more trenches are formed in the first dielectric layer 105 and the lower conductive structures 110A, 110B are formed in the one or more trenches by depositing the layers of the lower conductive structures 110A, 110B and performing a planarization process to remove material positioned over the first dielectric layer 105 outside the trenches. The one or more layers of the lower conductive structures 110A, 110B may be formed by at least one of ALD, PVD, CVD, ALCVD, LPCVD, UHVCVD, RPCVD, PECVD, MBE, LPE, spin coating, thermal evaporation, plating, or other suitable techniques. According to some embodiments, the first dielectric layer 105 and the lower conductive structures 110A, 110B are part of a metallization layer that is formed over one or more active devices, such as transistors, resistors, and/or other devices, formed in one or more layers with one or more layers of metal interconnecting at least some of the active devices.

In some embodiments, the etch stop layer 115 stops an etching process after the etching process has etched through the second dielectric layer 120. According to some embodiments, the etch stop layer 115 comprises a dielectric material having a different etch selectivity from the first dielectric layer 105. The etch stop layer 115 may comprise silicon nitride (SiN), silicon carbon nitride (SiCN), silicon carbon oxide (SiCO), carbon nitride (CN), or some other suitable etch stop material. The etch stop layer 115 is formed in any number of ways, such as by thermal growth, chemical growth, ALD, CVD, ALCVD, LPCVD, UHVCVD, RPCVD, PECVD, spin coating, and/or other suitable techniques. The proportions of silicon, carbon, nitrogen, or oxygen in the etch stop layer 115 may vary.

The second dielectric layer 120 differs in composition from the first dielectric layer 105. For example, the second dielectric layer 120 includes a composition having a different removal rate from that of the first dielectric layer 105. The removal rate may be associated with a wet etch, and/or a dry etch process. The second dielectric layer 120 may have a removal rate that is less than (e.g., retarded from) that of the first dielectric layer 105. In some embodiments, the second dielectric layer 120 comprises a silicon-rich composition. In one embodiment, the second dielectric layer 120 comprises a silicon-rich silicon oxide composition. For example, a typical silicon dioxide used in semiconductor fabrication has a $SiO_2$ phase. A silicon-rich oxide composition may include a composition of $SiO_x$, where x is less than 2. For example, in an embodiment, x may be between approximately 1 and approximately 1.6. In one embodiment, x may be between approximately 1.5 and 1.6. The second dielectric layer 120 is formed in any number of ways, such as by thermal growth, chemical growth, ALD, CVD, ALCVD, LPCVD, UHVCVD, RPCVD, PECVD, spin coating, and/or other suitable techniques.

In some embodiments, the etch resistant layer 125 is a dielectric layer that differs in composition from the second dielectric layer 120. For example, the etch resistant layer 125 includes a composition having a different removal rate from that of the second dielectric layer 120. The removal rate may be associated with a wet etch, and/or a dry etch process. The etch resistant layer 125 may have a removal rate that is less than (e.g., retarded from) that of the second dielectric layer 120. In some embodiments, the etch resistant layer 125 comprises amorphous carbon (a-C) or CN. For example, a layer formed from a-C or CN exhibits increased chemical bond energy in the crystalline structure, thereby increasing etch resistance. For example, the chemical bond energy of the material of the etch resistant layer 125 may be between about 150 and 300 eV. The chemical bond energy of the material of the etch resistant layer 125, in an embodiment where the etch resistant layer 125 comprises a-C may be between about 285 eV. The increased chemical bond energy of the etch resistant layer 125 provides the etch resistance that results in the reduced removal rate. The chemical bond energy of the material of the etch resistant layer 125 may be about at least 2-2.75 times the chemical bond energy of the second dielectric layer 120. The ratio of binding energies between the etch resistant layer 125 and the second dielectric layer 120 is a metric that illustrates the decreased removal rate for the etch resistant layer 125. The etch resistant layer 125 may have a thickness in the range of about 100-500 Angstroms. The etch resistant layer 125 is formed in any number of ways, such as by ALD, CVD, ALCVD, LPCVD, UHVCVD, RPCVD, PECVD, PVD, spin coating, and/or other suitable techniques.

Figure 2:
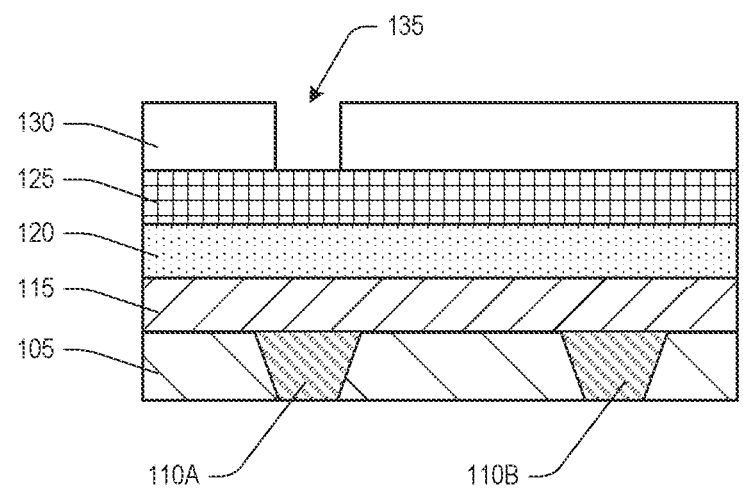

Referring to FIG. 2, a mask 130 is formed over the etch resistant layer 125, in accordance with some embodiments. The mask 130 may comprise a plurality of individually formed layers that together define a mask stack. In some embodiments, the mask 130 comprises at least one of a hard mask layer, a bottom antireflective coating (BARC) layer, an organic planarization layer (OPL), or a photoresist layer. The hard mask layer is formed by at least one of PVD, CVD, spin on, growth, or other suitable techniques. In some embodiments, the hard mask layer comprises at least one of silicon (e.g., polycrystalline silicon), oxygen, nitrogen, or other suitable materials. In some embodiments, the BARC layer is a polymer layer that is applied using a spin coating process. In some embodiments, the OPL comprises a photo-sensitive organic polymer that is applied using a spin coating process. In some embodiments, the OPL comprises a dielectric layer. In some embodiments, the photoresist layer is formed by at least one of spinning, spray coating, or other suitable techniques. The photoresist is a negative photoresist or a positive photoresist. With respect to a negative photoresist, regions of the negative photoresist become insoluble when illuminated by a light source, such that application of a solvent to the negative photoresist during a subsequent development stage removes non-illuminated regions of the negative photoresist. A pattern formed in the negative photoresist is thus a negative image of a pattern referring to opaque regions of a template, such as a mask, between the light source and the negative photoresist. In a positive photoresist, illuminated regions of the positive photoresist become soluble and are removed via application of a solvent during development. Thus, a pattern formed in the positive photoresist is a positive image of opaque regions of the template, such as a mask, between the light source and the positive photoresist. One or more etchants have a selectivity such that the one or more etchants remove or etch away one or more layers exposed or not covered by the photoresist at a greater rate than the one or more etchants remove or etch away the photoresist. Accordingly, an opening in the photoresist allows the one or more etchants to form a corresponding opening in the one or more layers under the photoresist, and thereby transfer a pattern in the photoresist to the one or more layers under the photoresist. The photoresist is stripped or washed away after the pattern transfer. The layers of the mask stack are patterned to define the mask 130. In some embodiments, the photoresist layer is exposed using a radiation source and a reticle to define a pattern in the photoresist layer, and portions of the photoresist layer are removed to define a patterned photoresist layer. The underlying OPL, BARC layer, and hard mask layer are etched using the patterned photoresist layer as a template to form the mask 130 and expose portions of the etch resistant layer 125 under the mask 130.

Figure 3:
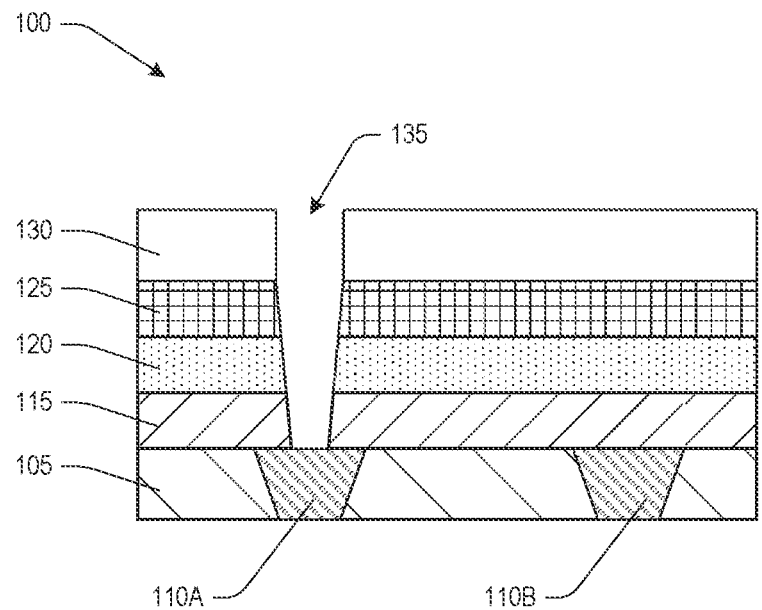

Referring to FIG. 3, the etch resistant layer 125, the second dielectric layer 120, and the etch stop layer 115 are patterned using the mask 130 as a removal template to form a via opening 135 exposing the conductive structure 115A, in accordance with some embodiments. The etch process for forming the via opening 135 may have different phases with different etch chemistries depending on the one of the etch resistant layer 125, the second dielectric layer 120, or the etch stop layer 115 being etched. In some embodiments, the etch resistant layer 125 is etched using a first etch chemistry, such as an argon etch chemistry, and the second dielectric layer 120 is etched using a second etch chemistry, such as fluorine or chlorine based etch chemistry, until the etch stop layer 115 is exposed. The etch stop layer 115 is etched using a third etch chemistry, such as an argon etch chemistry.

Figure 4:
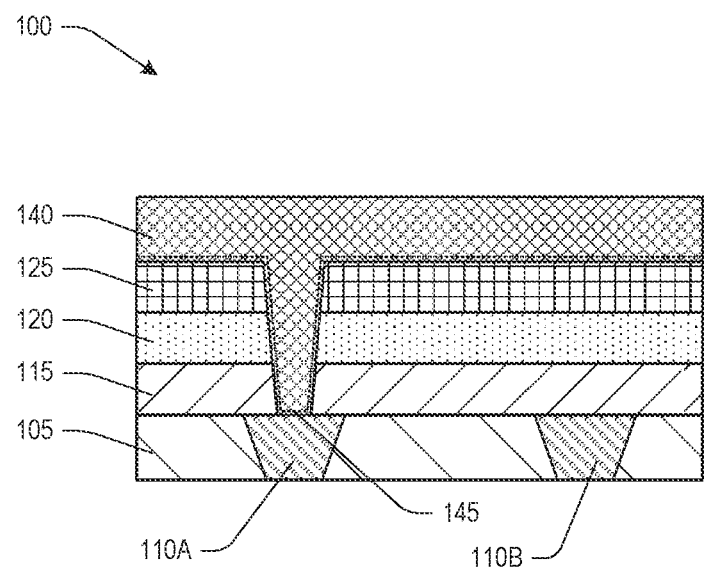

Referring to FIG. 4, the mask 130 is removed and a conductive structure 140 is formed in the via opening 135, in accordance with some embodiments. The mask 130 may be removed by acid washing, a selective etch process, such as a wet etch process, and/or other suitable techniques. The conductive structure 140 may comprise one or more barrier layers, a seed or glue layer, a metal fill layer, and/or other suitable layers. The barrier layer(s) and seed or glue layer are represented by a dashed line 145. Example barrier materials comprise tantalum nitride, tantalum, or some other suitable material. Example seed or glue layer materials include titanium or some other suitable material. Example metal fill layers comprise titanium nitride, tungsten, aluminum, copper, cobalt, and/or other suitable materials. The conductive structure 140 may be formed in the via opening 135 by depositing the layers of the conductive structure 140 by at least one of ALD, PVD, CVD, plating, or other suitable techniques.

Figure 5:
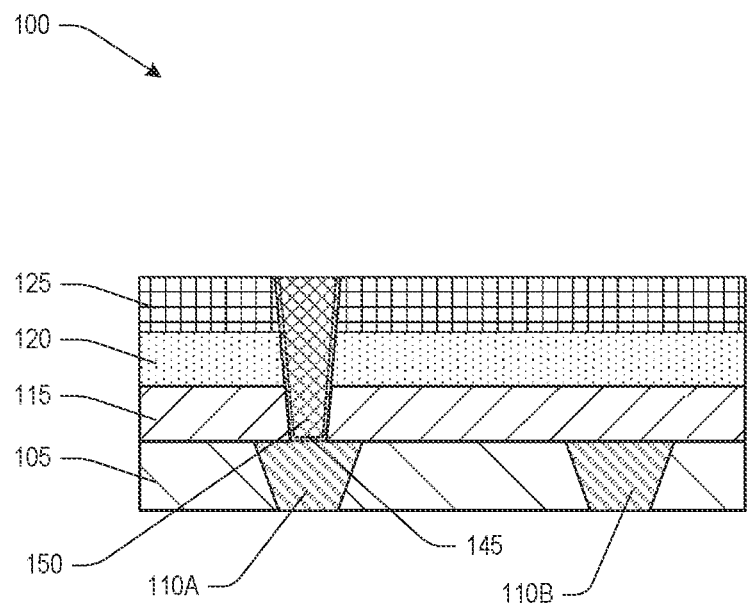

Referring to FIG. 5, portions of the conductive structure 140 formed over the etch resistant layer 125 are removed to define a conductive via 150, in accordance with some embodiments. A planarization process may be performed to remove the portions of the conductive structure 140, including the barrier layer(s), the seed or glue layer, and the conductive fill layer, formed over the etch resistant layer 125. In some embodiments, the etch resistant layer 125 has a negligible removal rate and the removal rate of the material of the conductive structure 140 is about 1200 Angstroms per minute as compared to a removal rate of about 140 Angstroms per minute for the material of the second dielectric layer 120. The etch resistant layer 125 acts as a stop layer to facilitate removal of the portions of the conductive structure 140 outside the via opening 135 without eroding the second dielectric layer 120.

Figure 6:
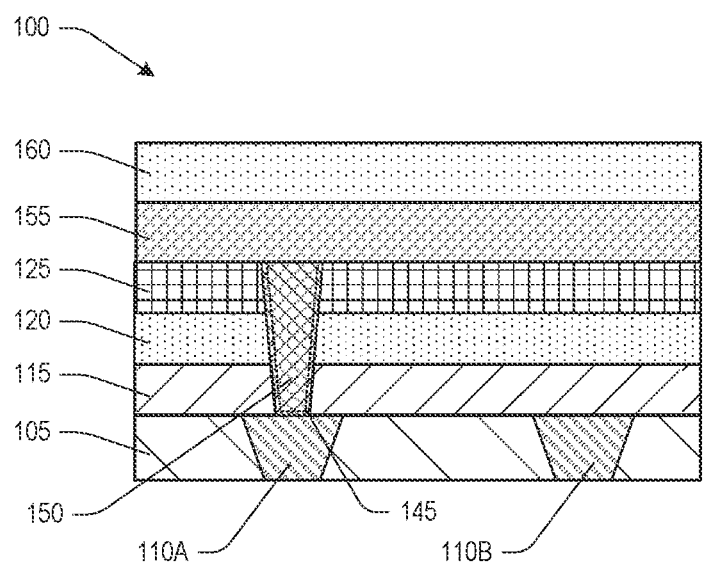

Referring to FIG. 6, a conductive layer 155 is formed over the conductive via 150 and the etch resistant layer 125 and a magnetic tunneling junction stack 160 is formed over the conductive layer 155, in accordance with some embodiments. The conductive layer 155 may have the same material composition as the conductive fill layer of the conductive via 150, for example, titanium nitride. The conductive layer 155 may be formed by at least one of ALD, PVD, CVD, plating, or other suitable techniques. A planarization process may be performed after forming the conductive layer 155 to provide a uniform surface of the conductive layer 155. In some embodiments, the magnetic tunneling junction stack 160 comprises a plurality of layers that define a storage element of a magnetic memory device. In some embodiments, the magnetic tunneling junction stack 160 comprises a pinning layer, a pinned layer, a barrier layer, and a free layer. Other structures and configurations of the magnetic tunneling junction stack 160 are within the scope of the present disclosure.

The pinning layer of the magnetic tunneling junction stack 160 is formed over the conductive layer 155 and may include an anti-ferromagnetic material. In anti-ferromagnetic materials, internal magnetic moments tend to align in alternating patterns. In this configuration, adjacent moments tend to cancel, and thus such materials tend to exhibit a minimal net magnetic field internally. Despite the minimal net field, anti-ferromagnetic materials may alter the behavior of magnetic fields of other materials in what is referred to as an exchange coupling effect. For example, an anti-ferromagnetic material may resist changes in the magnetic field of another exchange-coupled material. Anti-ferromagnetic materials include platinum manganese (PtMn), iridium manganese (IrMn), rhodium manganese (RhMn), iron manganese (FeMn), or other suitable anti-ferromagnetic materials. The pinning layer may be formed by a suitable deposition technique, such as a PVD process. In some embodiments, the pinning layer is omitted The pinned layer of the magnetic tunneling junction stack 160 is formed over the pinning layer, if present, and may include a ferromagnetic material, for example a cobalt-iron film (CoFe), a cobalt-iron-boron (CoFeB) film, or other suitable ferromagnetic materials. The pinned layer may also include other ferromagnetic materials, such as cobalt-iron-tantalum (CoFeTa), nickel-iron (NiFe), cobalt-iron (CoFe), cobalt-platinum (CoPt), cobalt-palladium (CoPd), iron-platinum (FePt), alloys of Ni, Co, and Fe, or other suitable materials. In some embodiments, the pinned layer includes a multilayer structure, for example, one or more layers containing a ferromagnetic material interspersed with one or more spacer layers containing an anti-ferromagnetic material such as a synthetic anti-ferromagnetic (SAF) material. In some embodiments, the pinned layer includes one or more layers containing a ferromagnetic material interspersed with one or more spacer layers containing a conductive material. In one such embodiment, a spacer layer includes Ru or another suitable material. Spacer layers may include titanium (Ti), Ta, copper (Cu), silver (Ag), or other suitable conductive materials. The ferromagnetic materials, the anti-ferromagnetic materials, and/or the conductive materials that make up the pinned layer may be applied and formed using a PVD or other suitable process.

The barrier layer of the magnetic tunneling junction stack 160 may be formed over the pinned layer. The barrier layer may include a non-magnetic material, such as magnesium (Mg) or other suitable materials. The barrier layer may include magnesium oxide (MgO), aluminum oxide ($Al_2O_3$), aluminum nitride (AlN), aluminum oxynitride (AlON), or other suitable non-magnetic materials. The materials of the barrier layer may be applied by a process including PVD or another suitable deposition process. In some embodiments, the barrier layer has a multilayer structure. For example, in one such embodiment, the barrier layer includes a first film of MgO and a second film of Mg over the first film. Such a structure may be formed by Mg deposition followed by Mg oxidation and subsequent Mg deposition. For example, a first magnesium film is formed by sputtering. The first film is then converted into an MgO film by applying an oxygen plasma. Subsequently, a second Mg layer is deposited on the MgO layer by sputtering.

The free layer of the magnetic tunneling junction stack 160 may be formed over the barrier layer. As with the pinned layer, the free layer may include a ferromagnetic material such as CoFe and/or CoFeB compound. The free layer may also include other ferromagnetic materials, such as CoFeTa, NiFe, CoFe, CoPt, CoPd, FePt, alloys of Ni, Co, and Fe, or other suitable materials.

Figure 7:
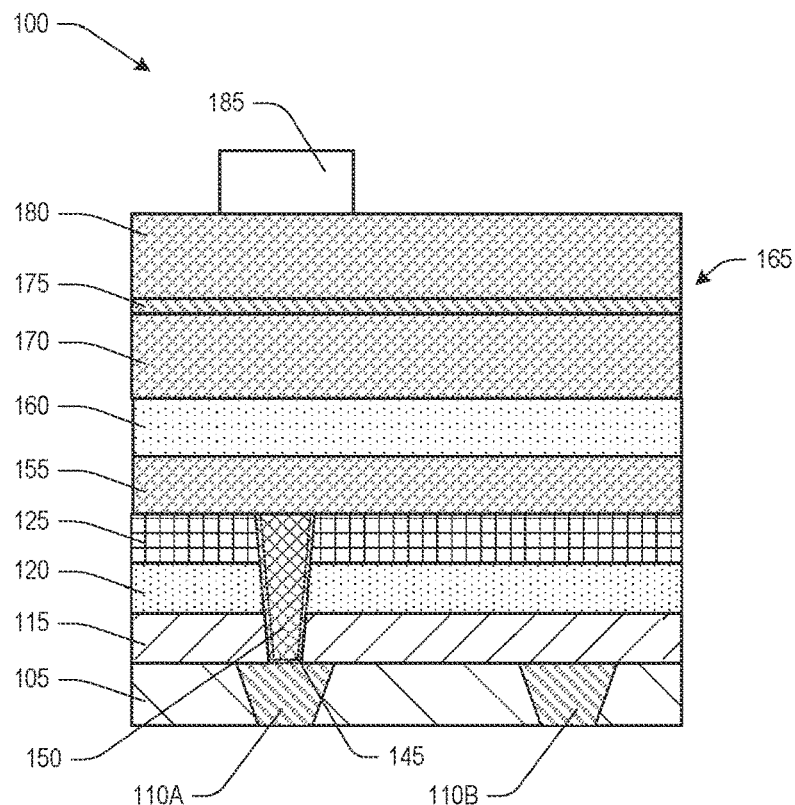

Referring to FIG. 7, an electrode stack 165 is formed over the magnetic tunneling junction stack 160 and a mask 185 is formed over the electrode stack 165, in accordance with some embodiments. In some embodiments, the electrode stack 165 comprises a first conductive layer 170, an intermediate dielectric layer 175 over the first conductive layer 170, and a second conductive layer 180 over the intermediate dielectric layer 175. In some embodiments, the intermediate dielectric layer 175 is omitted. The first conductive layer 170 may have the same material composition as the conductive fill layer of the conductive via 150, for example, titanium nitride. The first conductive layer 170 may be formed by at least one of ALD, PVD, CVD, plating, or other suitable techniques. The intermediate dielectric layer 175 may comprise silicon dioxide or other suitable materials. In some embodiments, the intermediate dielectric layer 175 comprises silicon dioxide formed using a tetraethyl orthosilicate (TEOS) precursor, which may be referred to as a TEOS oxide layer. The intermediate dielectric layer 175 may be formed by at least one of LPCVD, ALCVD, or other suitable techniques. The second conductive layer 180 may have the same material composition as the first conductive layer 170, for example, titanium nitride. The second conductive layer 180 may be formed by at least one of ALD, PVD, CVD, plating, or other suitable techniques. The mask 185 may comprise a plurality of individually formed layers that together define a mask stack. In some embodiments, the mask 185 comprises at least one of a hard mask layer, a BARC layer, an OPL, or a photoresist layer. In some embodiments, the hard mask layer is a TEOS oxide layer.

Figure 8:
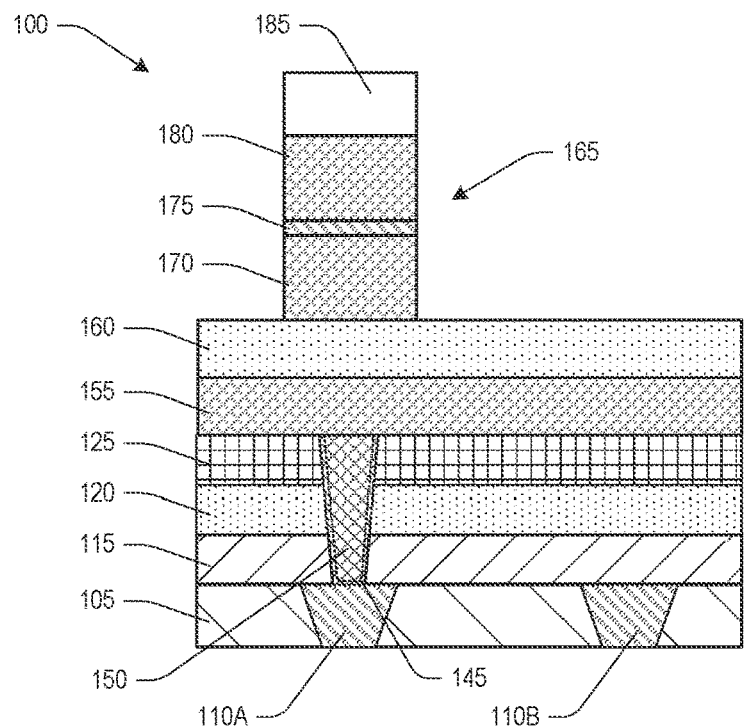

Referring to FIG. 8, the electrode stack 165 is patterned using the mask 185 as a removal template, in accordance with some embodiments. The etch process for patterning the electrode stack 165 may have different phases with different etch chemistries depending on the one of the first conductive layer 170, the intermediate dielectric layer 175, or the second conductive layer 180 being etched. The etch process for patterning the electrode stack 165 terminates upon exposure of the magnetic tunneling junction stack 160.

Figure 9:
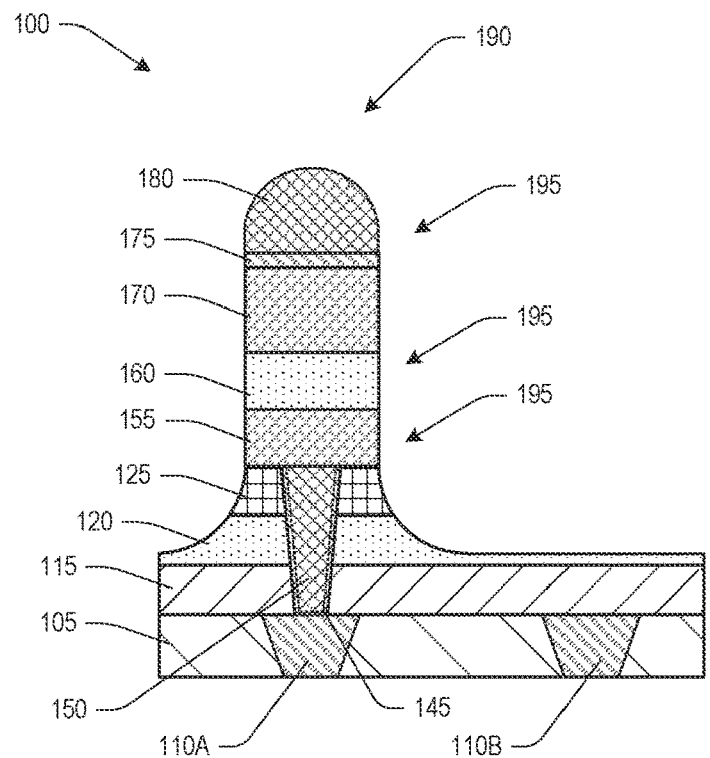

Referring to FIG. 9, the mask 185 is removed, and the magnetic tunneling junction stack 160, the conductive layer 155, the etch resistant layer 125, and the second dielectric layer 120 are patterned using the mask 185 as a removal template to define a memory structure 190, in accordance with some embodiments. The memory structure 190 comprises a bottom electrode 195 referring to a remaining portion of the conductive layer 155, a storage element 200 referring to a remaining portion of the magnetic tunneling junction stack 160, and a top electrode 205 referring to remaining portions of the first conductive layer 170, the intermediate dielectric layer 175, and the second conductive layer 180. A lower surface 155L of the bottom electrode overlays an upper surface 125U of the etch resistant layer 125.

In some embodiments, the patterning process to form the memory structure 190 comprises an ion beam etch. The ion beam etch may use argon plasma for the etch chemistry. The mask 185 may be removed during the etch process, and the corners of the second conductive layer 180 may be rounded. During the etch process, the etch resistant layer 125 is removed at a significantly smaller removal rate, such as about <70 Angstroms per minute compared to the removal rate of the second dielectric layer 120. The increasing etch resistance profile provided by the etch resistant layer 125, the second dielectric layer 120, and the etch stop layer 115 provide increased etch control. This enhanced etch control allows the etch process to be terminated prior to the complete removal of the second dielectric layer 120 without exposing and eroding the etch stop layer 115, which could result in exposing and damaging the conductive structure 110B adjacent the memory structure 190. In an embodiment where the etch resistant layer 125 comprises a-C or CN, the material does not impose a risk for generating a short in the magnetic tunneling junction stack 160 due to re-deposition, for example, along exposed sidewalls of the magnetic tunneling junction stack 160. The angle of the ion beam may be varied during the etch process. For example, an angle of between about 50 and 60 degrees, such as 55 degrees, provides an increased removal rate for the material of the second dielectric layer 120 compared to the removal rate of the etch resistant layer 125. In some embodiments, one or more spacer layers may be formed before the etching process of the magnetic tunneling junction stack 160, the conductive layer 155, the etch resistant layer 125, and the second dielectric layer 120, and portions of the spacer(s) may remain on sidewalls of the magnetic tunneling junction stack 160 and the conductive layer 155.

Figure 10:
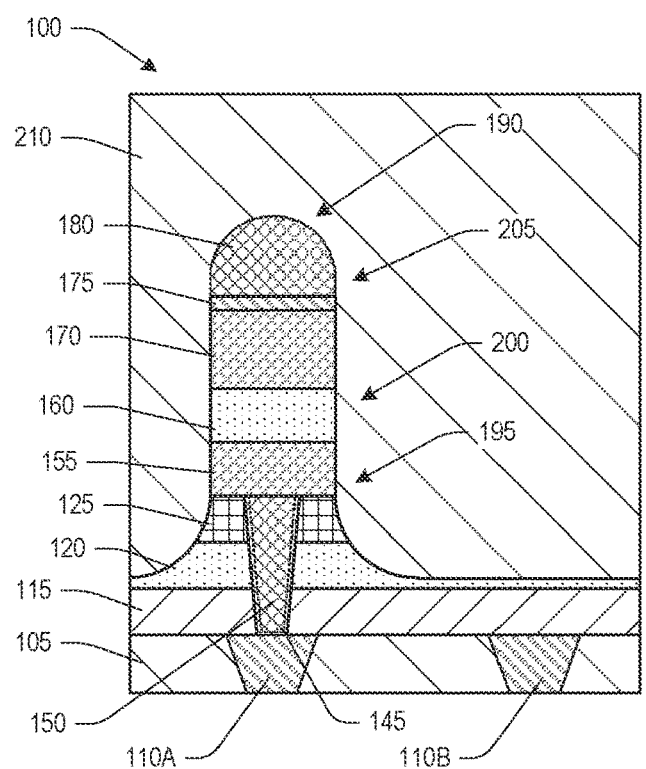

Referring to FIG. 10, a third dielectric layer 210 is formed over the memory structure 190, in accordance with some embodiments. The third dielectric layer 210 comprises silicon dioxide, a low-k dielectric material, one or more layers of low-k dielectric material, and/or other suitable materials. Low-k dielectric materials have a k value lower than about 3.9. The materials for the third dielectric layer 210 comprise at least one of Si, O, C, or H, such as SiCOH and SiOC, or other suitable materials. Organic material such as polymers may be used for the third dielectric layer 210. The third dielectric layer 210 may comprise at least one of a carbon-containing material, organo-silicate glass, a porogen-containing material, nitrogen, and/or or other suitable materials. The third dielectric layer 210 may be formed by at least one of LPCVD, ALCVD, spin-on technology, or other suitable techniques.

Figure 11:
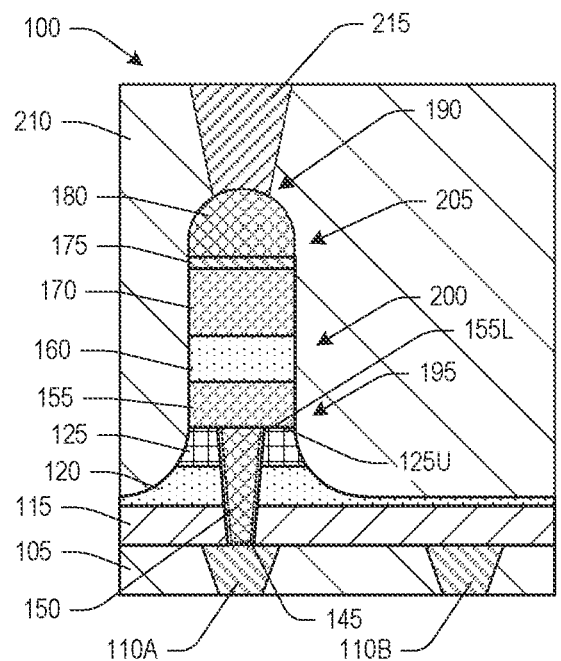

Referring to FIG. 11, a conductive structure 215 is formed in the third dielectric layer 210 to contact the top electrode 205 of the memory structure 190, in accordance with some embodiments. The conductive structure 215 may be formed in any number of ways, such as by a single damascene process, a dual damascene process, a trench silicide process, and/or other suitable techniques. In some embodiments, the conductive structure 215 may comprise a barrier layer, a seed layer, a metal fill layer, and/or other suitable layers. The metal fill layer comprises W, Al, Cu, Co, and/or other suitable materials. The conductive structure 215 may be formed by performing a removal process to form an opening in the third dielectric layer 210 and forming the layers of the conductive structure 215 in the opening and over the third dielectric layer 210. A planarization process is performed to remove portions of the conductive structure 215 outside the opening and over the third dielectric layer 210. Other structures and/or configurations of the conductive structure 215 are within the scope of the present disclosure.

Figure 12:
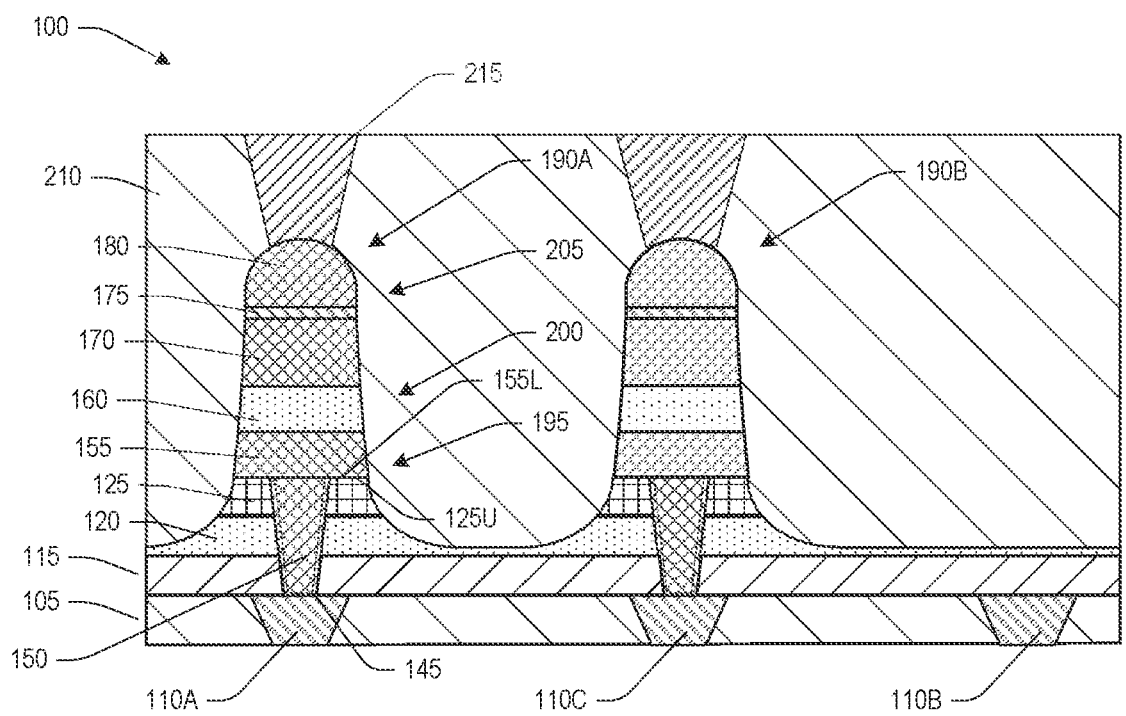

Referring to FIG. 12, two adjacent memory structures 190A, 190B are formed, in accordance with some embodiments. In some embodiments, as shown in FIG. 12, sidewalls one or more of the memory structures 190A, 190B are tapered or sloped as opposed to substantially vertical such as shown in FIG. 11. The etch resistant layer 125 provides enhanced etch control of the etch process for forming the memory structures 190A, 190B. This enhanced etch control reduces the likelihood of exposing the adjacent conductive structure 110B, reduces the likelihood of forming shorts on exposed sidewalls of the magnetic tunneling junction stack 160, and allows the thickness of the second dielectric layer 120 to be reduced compared to a process not using the etch resistant layer 125. This reduced thickness reduces the aspect ratio of the opening between the adjacent memory structures 190A, 190B, thereby reducing the likelihood of voids forming in the third dielectric layer 210 between the adjacent memory structures 190A, 190B.

A semiconductor structure includes a bottom electrode, a magnetic tunneling junction stack over the bottom electrode, a top electrode over the magnetic tunneling junction stack, a first dielectric layer under the bottom electrode, a second dielectric layer under the first dielectric layer. The first dielectric layer has a first chemical bond energy and the second dielectric layer has a second chemical bond energy less than the first chemical bond energy.

A method for forming a semiconductor structure includes forming a first dielectric layer, forming a second dielectric layer over the first dielectric layer, forming a via opening extending through the first dielectric layer and the second dielectric layer, and forming a conductive via in the via opening. A first conductive layer is formed over the second dielectric layer and the conductive via. A magnetic tunneling junction stack is formed over the first conductive layer. A second conductive layer is formed over the magnetic tunneling junction stack. A mask is formed over the second conductive layer. The second conductive layer, the magnetic tunneling junction stack, the first conductive layer, the second dielectric layer, and the first dielectric layer are patterned using the mask as a patterning template. The first dielectric layer has a first chemical bond energy and the second dielectric layer has a second chemical bond energy greater than the first chemical bond energy.

A memory structure includes a first dielectric layer, a second dielectric layer over the first dielectric layer, a conductive via extending through the first dielectric layer and the second dielectric layer, a first conductive layer over the second dielectric layer and contacting the conductive via, a lower surface of the first conductive layer overhanging an upper surface of the second dielectric layer, a magnetic tunneling junction stack over the first conductive layer, and a second conductive layer over the magnetic tunneling junction stack. The first dielectric layer has a first chemical bond energy and the second dielectric layer has a second chemical bond energy greater than the first chemical bond energy.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor structure, comprising:
   a bottom electrode;
   a magnetic tunneling junction stack over the bottom electrode;
   a top electrode over the magnetic tunneling junction stack;
   a first dielectric layer covered by the bottom electrode; and
   a second dielectric layer under the first dielectric layer, wherein:
   the first dielectric layer has a first chemical bond energy,
   the second dielectric layer has a second chemical bond energy, and
   the first chemical bond energy is at least two times the second chemical bond energy.

2. The semiconductor structure of claim 1, comprising:
   a via contacting the bottom electrode and extending through the first dielectric layer and the second dielectric layer.

3. The semiconductor structure of claim 2, wherein a lower surface of the bottom electrode overhangs an upper surface of the first dielectric layer.

4. The semiconductor structure of claim 2, comprising:
   an etch stop layer under the second dielectric layer, wherein the via extends through the etch stop layer.

5. The semiconductor structure of claim 1, wherein the first chemical bond energy is between 150 and 300 eV.

6. The semiconductor structure of claim 1, wherein:
   the first dielectric layer comprises at least one of amorphous carbon or carbon nitride, and
   the second dielectric layer comprises silicon rich oxide.

7. The semiconductor structure of claim 1, wherein the top electrode comprises:
   a first conductive layer;
   a third dielectric layer over the first conductive layer; and
   a second conductive layer over the third dielectric layer.

8. The semiconductor structure of claim 1, comprising:
   an etch stop layer under the second dielectric layer, wherein the etch stop layer comprises at least one of silicon nitride, silicon carbon nitride, silicon carbon oxide, or carbon nitride.

9. A method for forming a semiconductor structure, comprising:
   forming a first dielectric layer;
   forming a second dielectric layer over the first dielectric layer;
   forming a via opening extending through the first dielectric layer and the second dielectric layer;
   forming a conductive via in the via opening;
   forming a first conductive layer over the second dielectric layer and the conductive via;
   forming a magnetic tunneling junction stack over the first conductive layer;
   forming a second conductive layer over the magnetic tunneling junction stack;
   forming a mask over the second conductive layer; and
   patterning the second conductive layer, the magnetic tunneling junction stack, the first conductive layer, the second dielectric layer, and the first dielectric layer using the mask as a patterning template, wherein the first dielectric layer has a first chemical bond energy and the second dielectric layer has a second chemical bond energy between 150 and 300 eV and greater than the first chemical bond energy.

10. The method of claim 9, wherein forming the conductive via comprises:
    forming a third conductive layer over the second dielectric layer and in the via opening; and
    planarizing the third conductive layer using the second dielectric layer as a stop layer.

11. The method of claim 9, comprising:
    forming a third dielectric layer over the second conductive layer; and
    forming a third conductive layer over the third dielectric layer, wherein forming the mask comprises forming the mask over the third conductive layer.

12. The method of claim 9, comprising:
    forming an etch stop layer under the first dielectric layer, wherein the conductive via extends through the etch stop layer.

13. The method of claim 12, wherein:
    patterning the second conductive layer, the magnetic tunneling junction stack, the first conductive layer, the second dielectric layer, and the first dielectric layer using the mask as the patterning template comprises removing a first portion of the first dielectric layer, and
    a second portion of the first dielectric layer remains over the etch stop layer after the patterning.

14. The method of claim 13, comprising:
    forming a first conductive structure contacting the conductive via; and
    forming a second conductive structure adjacent the first conductive structure, wherein:
    the etch stop layer is over the second conductive structure, and
    the second portion of the first dielectric layer is over the etch stop layer and over the second conductive structure.

15. The method of claim 9, wherein after patterning the second conductive layer, the magnetic tunneling junction stack, the first conductive layer, the second dielectric layer, and the first dielectric layer using the mask as the patterning template, a lower surface of the first dielectric layer overhangs an upper surface of the first dielectric layer.

16. The method of claim 9, wherein:
    forming the first dielectric layer comprises forming the first dielectric layer comprising at least one of amorphous carbon or carbon nitride, and
    forming the second dielectric layer comprises forming the second dielectric layer comprising silicon rich oxide.

17. A semiconductor structure, comprising:
    a bottom electrode;
    a magnetic tunneling junction stack over the bottom electrode;
    a top electrode over the magnetic tunneling junction stack;
    a first dielectric layer covered by the bottom electrode; and
    a second dielectric layer under the first dielectric layer, wherein:
    the first dielectric layer has a first chemical bond energy between 150 and 300 eV, and
    the second dielectric layer has a second chemical bond energy less than the first chemical bond energy.

18. The semiconductor structure of claim 17, wherein:
    the first dielectric layer comprises at least one of amorphous carbon or carbon nitride, and
    the second dielectric layer comprises silicon rich oxide.

19. The semiconductor structure of claim 17, comprising:
a via contacting the bottom electrode and extending through the first dielectric layer and the second dielectric layer.
20. The semiconductor structure of claim 17, comprising an etch stop layer under the second dielectric layer.

* * * * *